(12) United States Patent
Privitera et al.

(10) Patent No.: US 8,453,917 B1
(45) Date of Patent: Jun. 4, 2013

(54) WAVE SOLDERING OF SURFACE-MOUNTING ELECTRONIC DEVICES ON PRINTED CIRCUIT BOARD

(71) Applicant: STMicroelectronics S.r.l., Agrate Brianza (IT)

(72) Inventors: Concetto Privitera, Gravina Di Catania (IT); Cristiano Gianluca Stella, San Gregorio Di Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 13/655,555

(22) Filed: Oct. 19, 2012

(30) Foreign Application Priority Data

Nov. 17, 2011 (IT) .............................. MI2011A2084

(51) Int. Cl.
*B23K 31/02* (2006.01)

(52) U.S. Cl.
USPC ..................... 228/179.1; 228/248.1; 228/256; 228/260

(58) Field of Classification Search
None
See application file for complete search history.

(56) References Cited

U.S. PATENT DOCUMENTS

| | | | |
|---|---|---|---|
| 3,500,538 A | | 3/1970 | Raciti |
| 3,925,596 A | * | 12/1975 | Siden ............................ 174/261 |
| 4,535,385 A | | 8/1985 | August et al. |
| 4,726,506 A | * | 2/1988 | Kondo ............................ 228/37 |
| 4,761,881 A | * | 8/1988 | Bora et al. ....................... 29/840 |
| 4,818,823 A | * | 4/1989 | Bradley ........................ 174/259 |
| 4,982,376 A | * | 1/1991 | Megens et al. ................. 361/760 |
| 5,155,904 A | * | 10/1992 | Majd ................................ 29/837 |
| 5,330,096 A | * | 7/1994 | Belanger, Jr. ............. 228/180.22 |
| 5,626,278 A | * | 5/1997 | Tang ............................. 228/56.3 |
| 5,811,736 A | * | 9/1998 | Lauffer et al. ................. 174/263 |
| 5,874,043 A | * | 2/1999 | Sarkhel et al. ................. 420/557 |
| 6,009,619 A | * | 1/2000 | Lauffer ............................. 29/847 |
| 6,305,596 B1 | * | 10/2001 | Lin et al. ........................ 228/125 |
| 6,369,334 B1 | * | 4/2002 | Lauffer ........................... 174/261 |
| 6,471,111 B1 | * | 10/2002 | Hertz et al. .................. 228/111.5 |
| 6,693,029 B2 | | 2/2004 | Iijima et al. |
| 2002/0079353 A1 | * | 6/2002 | Graves et al. ............... 228/179.1 |

(Continued)

FOREIGN PATENT DOCUMENTS

| | | |
|---|---|---|
| EP | 1711041 A2 | 4/1929 |
| GB | 2210818 A | 6/1989 |
| JP | 01-132198 A * | 5/1998 |

OTHER PUBLICATIONS

Italian Search Report for MI2011A002084 mailed Sep. 15, 2012 (3 pages).

*Primary Examiner* — Kiley Stoner
(74) *Attorney, Agent, or Firm* — Gardere Wynne Sewell LLP

(57) ABSTRACT

A system includes a device of the surface-mounting type having an insulating package provided with a mounting surface and a contact pin exposed on the mounting surface. The device is attached to an insulating board including a gluing surface and an opposite surface. The process for manufacturing the system includes forming through holes a contact region on the gluing surface. The mounting surface is glued to the gluing surface with the contact pin aligned with the contact region. Wave soldering is performed to electrically join the device to the board by hitting the opposite surface with a wave of soldering paste to form, by capillary action with the soldering paste ascending in the through holes up to the overflow on the gluing surface, a conductive contact electrically connecting the contact pin of the electronic device through a solder connection to the contact region of the electronic board.

22 Claims, 4 Drawing Sheets

U.S. PATENT DOCUMENTS

| | | | |
|---|---|---|---|
| 2002/0125581 A1* | 9/2002 | Lin | 257/778 |
| 2003/0057265 A1* | 3/2003 | Aspandiar et al. | 228/260 |
| 2003/0216066 A1* | 11/2003 | Arrigotti et al. | 439/79 |
| 2005/0017739 A1* | 1/2005 | Hamren et al. | 324/750 |
| 2005/0023034 A1* | 2/2005 | Ishida et al. | 174/264 |
| 2006/0216972 A1* | 9/2006 | Modinger | 439/83 |
| 2007/0095879 A1* | 5/2007 | Holmes | 228/260 |
| 2008/0023840 A1* | 1/2008 | Lewis et al. | 257/773 |
| 2008/0064232 A1* | 3/2008 | Reiss et al. | 439/66 |
| 2008/0180900 A1* | 7/2008 | Domitrovits et al. | 361/684 |
| 2008/0307643 A1* | 12/2008 | Sozansky | 29/839 |
| 2011/0162204 A1* | 7/2011 | Reiss et al. | 29/874 |

* cited by examiner

WAVE SOLDERING OF SURFACE-MOUNTING ELECTRONIC DEVICES ON PRINTED CIRCUIT BOARD

PRIORITY CLAIM

This application claims priority from Italian Application for Patent No. MI2011A002084 filed Nov. 17, 2011, the disclosure of which is hereby incorporated by reference.

TECHNICAL FIELD

The solution according to one or more embodiments refers to the electronics field. In more detail, the solution according to one or more embodiments relates to the wave soldering technique.

BACKGROUND

In the prior art numerous assembly processes for electronic systems adapted to large-scale production are diffused. Basically, every assembly process involves mounting one or more electronic devices on an electronic board (for example, a Printed Circuit Board or PCB). Generally, any electronic device comprises one (or more) chip of semiconductor material on which an electronic component (or an electronic microcircuit) is integrated. The chip is encapsulated in a package of insulating material to be isolated and protected from the external environment. The package exposes conductive pins, which are coupled to corresponding terminals of the conductive chip. The pins of the package are soldered to the conducting tracks formed on the electronic board. This allows the interaction between the electronic component, encapsulated in the package, and other electronic devices mounted on the electronic board in a similar way, through the conducting tracks properly connected to each other.

The soldering between the pins of electronic devices and tracks the electronic board should be performed homogenously to ensure proper operation and/or performance of the electronic system. At the same time, the soldering should ensure a stable mechanical connection between the electronic devices and the electronic board.

For example, a known soldering technique is the wave soldering technique. In this case, the electronic devices are initially glued on the electronic board by means of an adhesive paste, so that the pins of the electronic device correspond to soldering areas on the electronic board. Subsequently, the assembly thus obtained is placed over a bath of molten soldering paste, with a gluing surface of the electronic board (on which electronic devices are glued) facing downward. The assembly is then flooded with a wave of molten soldering paste, which laps the electronic board so as to bind to the soldering areas of the electronic board soldering the pins of electronic devices. In this way, the electronic devices are mechanically and electrically coupled to the electronic board.

The wave soldering technique described above, however, may be problematic with certain types of electronic devices. For example, this may occur in the case of Surface-Mounting Technology (SMT) electronic devices having, instead of pins protruding from the package, pins consisting of areas of exposed metal on a mounting surface of the package of the electronic device on the electronic board—devices known in the art as "No-Lead" or "Micro-Lead"—especially if small sized.

In fact, a gap that is formed after the gluing of the package, between the pins of these "No-Lead" or "Micro-Lead" devices and the soldering areas may be too narrow for allowing the wave of soldering paste to enter therein in an optimal way—in particular, in the case of pins with a relatively extended surface. Moreover, it may happen that, after the gluing, the electronic devices result positioned with the mounting surface not perfectly parallel to the electronic board due to a reduced number and/or a sub-optimal allocation of disposition sites at which the most common adhesive pastes are dispensed on the mounting surface of the electronic devices. Furthermore, the scaling of the electronic device accordingly reduces its mounting surface, while the size of the pins remain essentially unchanged to ensure the same current density delivered by the device, thereby reducing the available space on the mounting surface for the gluing points—for example, space for gluing points may not be available in some locations at the perimeter of the mounting surface. Therefore, due to the imperfect positioning of the electronic devices on the electronic board, during wave-soldering the soldering paste may be distributed not homogenously. For these reasons, it may happen that the coupling between the pins and soldering areas of the card is not satisfactory or is not achieved at all. The electronic system so assembled would have both performance and a useful life lower than expected, up to the limit being completely broken.

SUMMARY

In general terms, the solution according to one or more embodiments aims to improve the wave soldering.

In particular, one or more aspects of the solution according to specific embodiments are set out in the independent claims, with advantageous features of the same solution that are set out in the dependent claims, whose wording is herein incorporated verbatim by reference (with any advantageous features provided with reference to a specific aspect of the solution according to an embodiment which apply mutatis mutandis at any other aspect thereof).

More specifically, one aspect of a solution according to an embodiment provides a method for producing an electronic system. The electronic system comprises at least one electronic device of surface-mounting type, with an insulating package provided with a mounting surface and at least one pin contact exposed on the mounting surface. The electronic system also comprises an electronic board having an insulating substrate to support electronic devices. The insulating substrate comprises a gluing surface and a surface opposite to the gluing surface. The method comprises the steps of forming a plurality of through holes in at least one contact region on the gluing surface of the electronic board, gluing on the gluing surface of the electronic board at least one electronic device (aligning the at least one contact pin with the at least one contact region), placing an assembly comprising the at least one electronic device glued to the electronic board in a bath of soldering paste, and wave-soldering the at least one electronic device to the electronic board. In the solution the step of wave-soldering comprises hitting the surface of the electronic board opposite to the gluing surface with a wave of soldering paste to form, by capillary ascending of the soldering paste in the through holes up to the overflow on the gluing surface, at least one conducting contact that contacts the at least one pin of the electronic device by soldering it to the electronic board.

BRIEF DESCRIPTION OF THE DRAWINGS

A solution according to one or more embodiments, as well as additional features and its advantages will be better understood with reference to the following detailed description of an embodiment thereof, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated and/or simplified) and that, unless otherwise specified, they are simply intended to conceptually illustrate the structures and procedures described herein. In particular.

DETAILED DESCRIPTION OF THE DRAWINGS

Figure 1:
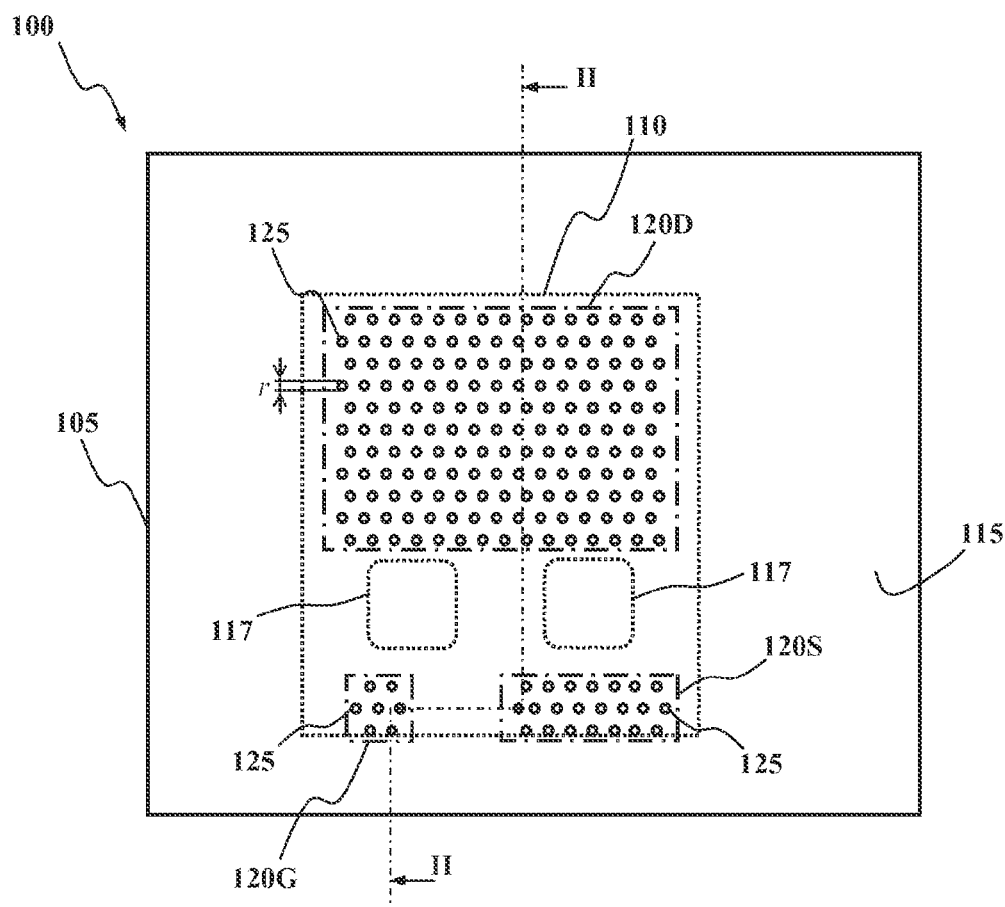
FIG. 1 illustrates a schematic plan view of a portion of an electronic board according to an embodiment.

FIG. 1 is a schematic plan view of a portion of an electronic board 100 according to an embodiment.

The electronic board 100 is, for example, a Printed Circuit Board or PCB. The electronic board 100 comprises an insulating substrate 105 formed of an insulating material (e.g., comprising FR-4 fiberglass and epoxy resin), which is designed to support one or more electronic devices—for example, in plan-size (identified by the reference 110) in FIG. 1 of an electronic device to be mounted on board 100 is drawn with a dashed line. The substrate 105 is provided with a gluing surface 115, on which the electronic device may be glued via an adhesive paste disposed in at least one disposition site, for example, two disposition sites 117 represented in FIG. 1 with a dashed line.

On the gluing surface 115 is defined a plurality of contact regions 120S, 120D and 120G, also shown with dashed lines, for forming contacts (not shown in the figure, described later in the present description) designed for corresponding to respective pins of the electronic device to be mounted on the electronic board 100. In the example at issue, where the electronic device to be mounted to the electronic board is a power MOS transistor, a gate contact region 120G, a source contact region 120S and a drain contact region 120D are formed.

Typically, the electronic board 100 also comprises conducting tracks (not shown in the figures for simplicity), which electrically connect together multiple electronic devices mounted on the electronic board 100.

In the solution according to an embodiment, at each contact region 120S, 120D and 120G is formed a plurality of through holes 125 that pass through the electronic board 100. The quantity of through holes 125 provided in each one of the contact regions 120S, 120D and 120G is preferably, although not exhaustively, proportional to an extension thereof.

Figure 2:
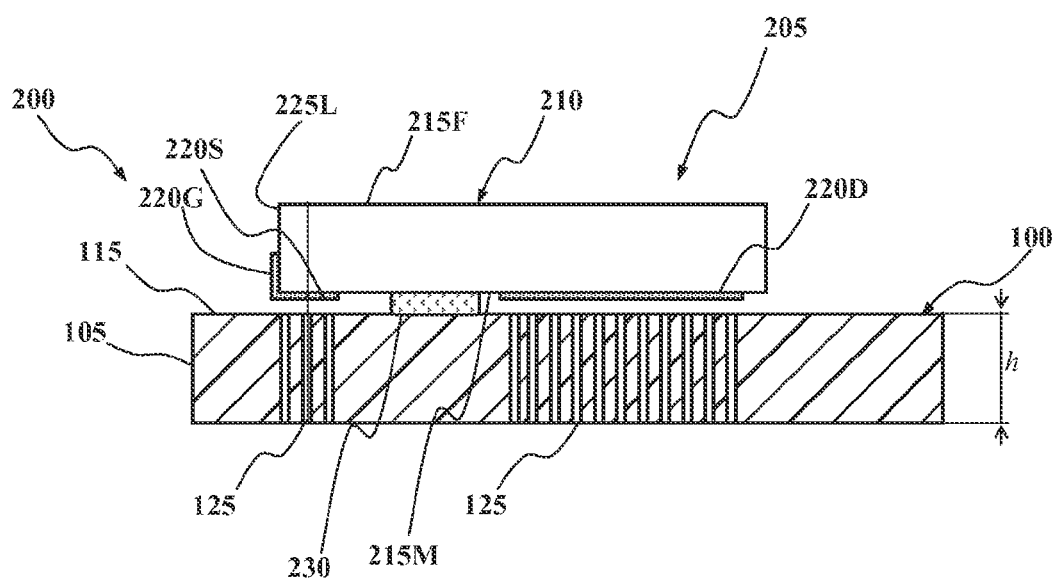
FIG. 2 illustrates a schematic cross-sectional side view according to the plan II-II of an electronic assembly comprising the electronic board of FIG. 1.

Turning now to FIG. 2, there is illustrated a schematic cross-sectional side view according to the plan II-II of an assembly 200 comprising the electronic board 100 of FIG. 1.

The electronic assembly 200 further comprises an electronic device 205 of the No-Lead (or Micro-Lead) SMT type glued on the electronic board 100. The electronic device 205 comprises a package 210 made of an insulating material (e.g., plastic, epoxy or ceramic); the package 210 has for example a substantially parallelepiped shape with two main surfaces, namely, a mounting surface 215M (for mounting on the PCB 100) and a free surface 215F opposed to the same. The package 210 houses inside one (or more) chip of a semiconductor material, not visible in the figures, in which an electronic component is integrated—from a single element, for example, a transistor (of any type known such as MOSFET, IGBT, BJT, etc.), up to a complete circuit, for example, a central processing unit. In the following, purely by way of example, let assume that within the package 210 is housed a power MOS transistor.

In order to achieve an electrical path between the chip and elements external to the electronic device 205—thereby allowing to connect electronic component to other electronic components, not shown in the figures—the package 210 comprises a plurality of conductive pins, in the example here considered a source pin 220S, a gate pin 220G and a drain pin 220D; each of the pins 220S, 220G, 220D is electrically connected to corresponding terminals of the chip (e.g., by connecting wires, or "wire bonds" in jargon, comprised in the package 210, not shown in the figures). For example, the pin 220D is connected to a drain terminal, the pin 220S is connected to a source terminal and the pin 220G is connected to a gate terminal of a power MOS transistor integrated in the chip.

The pins 220S, 220G are generally rectangular in shape and extend partly on the mounting surface 215M and partly on a side surface 225L of the package 210. In the example at issue, the pin 220D is fully exposed on the mounting surface 215M with a generally rectangular shape, and covers about half of the mounting surface 215M; the pin 220D also acts as a heat sink (i.e., the chip is mounted on said drain pin 220D). In other embodiments (not shown in the figures), even the drain pin may extend partly on one or more side surfaces of the insulating package.

The electronic assembly 200 of FIG. 2 is formed by gluing the electronic device 205 to the electronic board 100. In detail, an adhesive paste 230 is disposed on the electronic board 100 in available disposition sites 117 previously described, which are located preferably, although without limitation, between the source and gate contact regions 120S, 120G, and the drain contact region 120D.

Figure 3A:
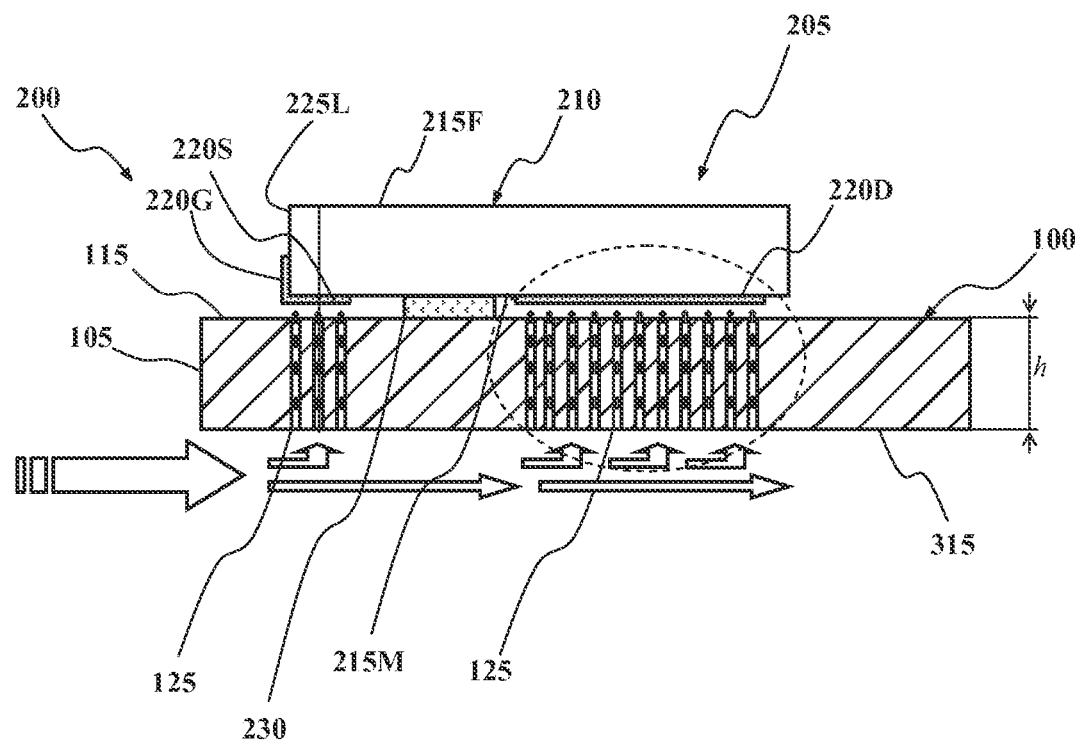
FIG. 3A illustrates a cross-sectional view similar to that of FIG. 2, with schematized a wave of soldering paste.
Figure 3B:
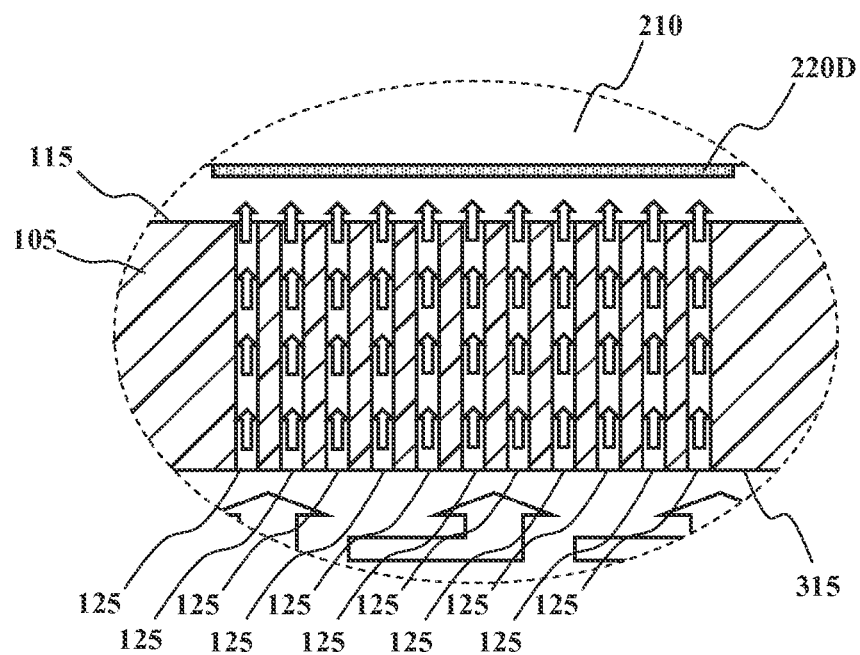
FIG. 3B shows a detail of FIG. 3A on an enlarged scale.

Turning now to FIGS. 3A and 3B together the electronic assembly 200 is hit by a wave of soldering paste at a bottom surface 315 of the insulating substrate 105 of the electronic board 100, bottom surface 315 that is opposite to the gluing surface 115 (in contrast with what is known in the art, in which, as explained in the introduction, the gluing surface of the electronic board is hit by the wave of soldering paste). In other words, the electronic assembly 200 is placed in a bath of soldering paste (not shown) with the gluing surface 115 facing upwards, i.e., opposite to the free surface (not shown) of the bath of soldering paste.

When the wave of soldering paste (which is conceptually illustrated in the figure by arrows) touches the bottom surface 315 of the electronic board 100, thanks to the known phenomenon of capillary action, it occurs that the soldering paste ascends in the through holes 125 filling them, up to emerge on the gluing surface 115 of electronic board 100. Preferably, the diameter 2r of the holes 125 is predetermined in relation with the density ρ of the molten soldering paste (used in the wave-soldering) and the thickness h of the insulating substrate 105 of the electronic board 100 (to ensure that the soldering paste will emerge on the gluing surface 115) by capillary action relationship:

$$h = \frac{4\gamma\cos\theta}{\rho g 2r},$$

where γ is the surface tension (measured in N/m) of the soldering paste (molten, i.e. in liquid phase), θ is the angle between the tangent to the surface of the soldering paste at the point of contact with the inner wall of the through holes 125 and the inner wall itself (taking into account the known surface tension effect) and g is the gravity acceleration constant (about 9.81 m/s$^2$). For example, when the insulating substrate 105 has a thickness h between 1 mm and 1.6 mm holes with a diameter 2r preferably between 0.3 mm and 1.5 mm may be provided using common soldering pastes.

Once ascended up to the gluing surface 115, the soldering paste wets and binds to the pins 220S, 220G and 220D arranged aligned above contact regions 120S, 120D and 120G, respectively. Thanks to the plurality of through holes 125 formed in the contact regions 120S, 120D and 120G of the electronic board 100, the wave of soldering paste can reach every portion of the surfaces of the pins 220G, 220S and 220D of the electronic device 205 substantially without encountering obstacles.

It should be noted that the surfaces of the pins 220G, 220S, and 220D can be reached in a sufficiently homogeneous manner even if their distance from the gluing surface 115 of the electronic board 100 is reduced (e.g., in an electronic assembly 200 made with small quantities of adhesive paste 230), or in the case in which the mounting surface 215M of the electronic device 205 is not perfectly parallel to the gluing surface 115 of electronic board 100 (e.g., due to a reduced number and/or a sub-optimal distribution of the disposition sites).

Subsequently, the soldering paste is cooled in order to harden.

Figure 4:
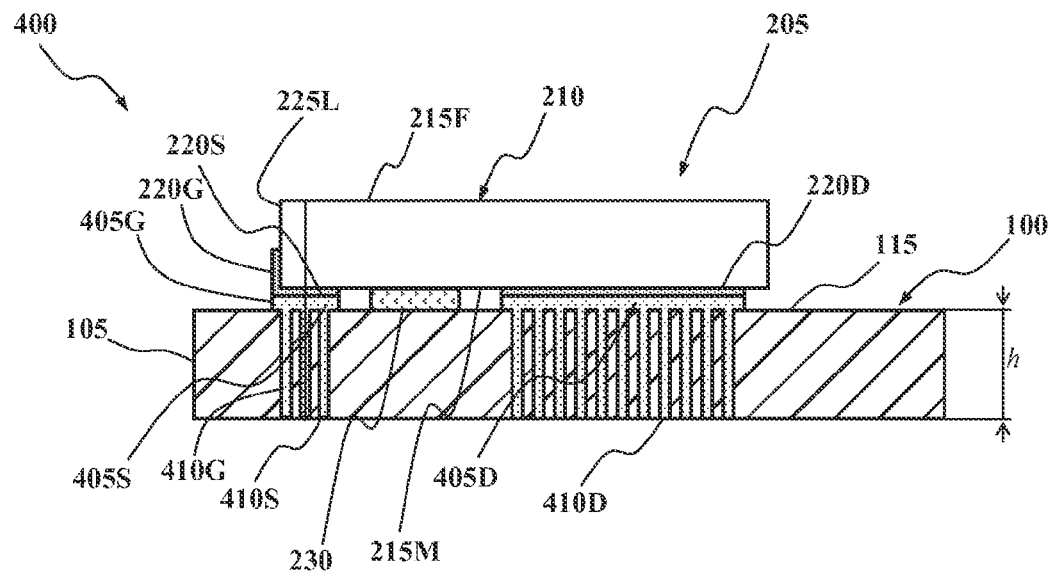
FIG. 4 illustrates, in a view similar to that of FIG. 2, an electronic system at the end of a wave soldering.

Turning to FIG. 4, it illustrates (in a cross-sectional view similar to those of FIGS. 2 and 3A) an electronic system 400 obtained from the electronic assembly 200 of FIG. 2 at the end of the wave soldering.

Once hardened, the soldering paste forms a source contact 405S, a gate contact 405G and a drain contact 405D; these contacts 405S, 405D and 405G create an electrical, mechanical and thermal coupling robust and efficient between the pin 220G, the pin 220D and pin 220S, respectively, and the electronic board 100—in order to obtain the electronic system 400. At the same time, the soldering paste hardened inside the through holes produces source 410S, gate 410G and drain 410D thermally conductive paths (thermal vias); such thermal vias 410S, 410G, 410D allows transferring more effectively in the outside the heat transferred from the chip (encapsulated in the insulating package 210) to the pins 220S, 220G and 220D, respectively, and effectively disperse the same into the environment surrounding the electronic system 400 (advantageously reducing an operating temperature of the electronic device 205). In addition, the source 410S, gate 410G and drain 410D thermal vias are formed integral with the respective source 405S, gate 405G and drain 405D contacts. This continuity—from a structural and used material point of view—between the thermal vias 410S, 410D and 410G, and the respective contacts 405S, 405D and 405G gives an improved mechanical robustness to the electronic system 400 and at the same time improves the heat sinking from the chip of the electronic device 205 to the external environment (since, the thermal resistance results substantially lower than in the case where contacts and thermally conductive paths are formed separately and/or of heterogeneous materials).

It should be noted that, thanks to the solution according to an embodiment, it is possible to form a sufficiently uniform coupling between the pins 220G, 220S and 220D and the electronic board 100—from a mechanical, electrical and heat point of view—even when the electronic device 205 (of the "No-Lead" or "Micro-Lead" STM-type) is small sized; this allows to obtain optimal, or at least improved, performance and useful life for the electronic system 400.

Figure 5:
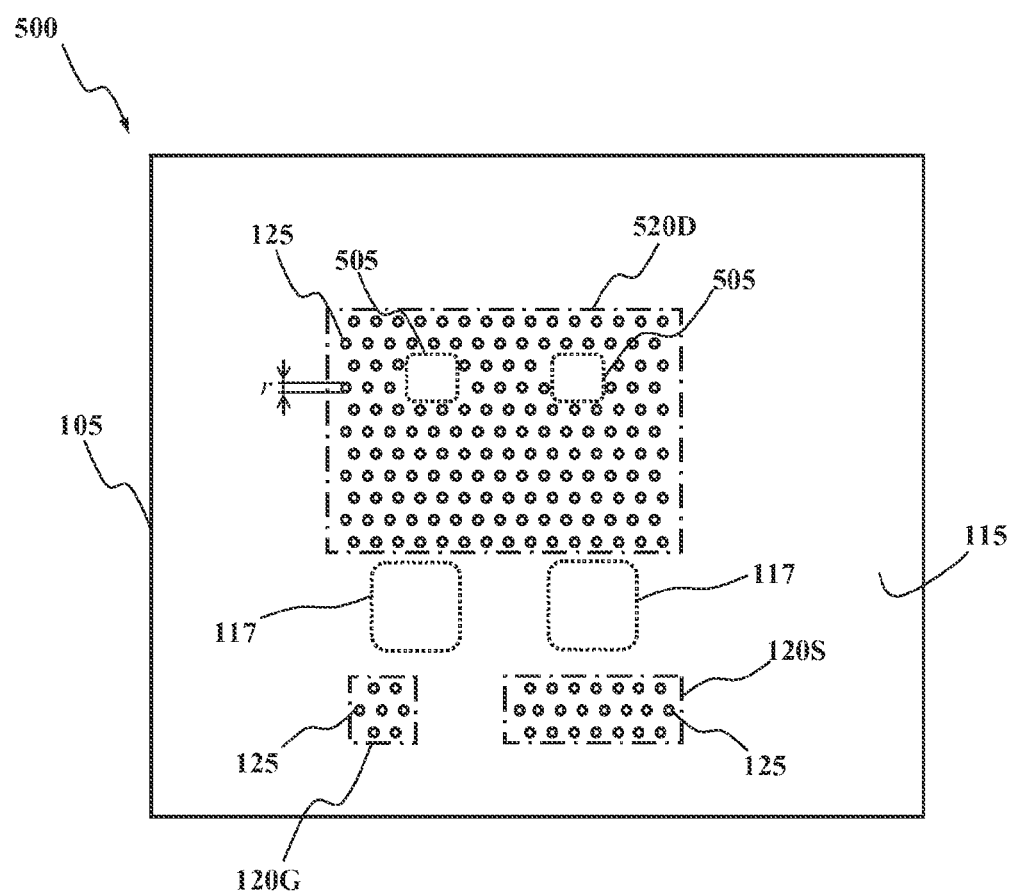
FIG. 5 illustrates a schematic plan view of a portion of an electronic board according to another embodiment.

Turning now to FIG. 5, therein it is schematically illustrated a plan view of a portion of an electronic board 500 according to another embodiment.

The electronic board 500 differs from the electronic board described above in the following.

In contact regions preferably, although without limitation, corresponding to pins of biggest extension more additional disposition sites of the gluing paste are defined. With reference to the example at issue, a drain contact region 520D (corresponding to the drain pin 220D of the electronic device to be mounted on the electronic board, characterized by an area substantially greater than the pins 220S and 220G) two additional disposition sites 505 are defined, conceptually identified by dashed lines in the figure.

In detail, the disposition sites 505 are areas of the contact region 520D deprived of holes 125; in this way, it is possible to dispose adhesive paste in the disposition sites 505. Thanks to the additional disposition sites 505, it is possible to have three or more disposition sites not aligned one another, thus able to define a geometric plane. Indeed, the additional disposition sites 505 are added to the disposition sites 117 already available between the contact regions 120S, 120G, and the contact region 520D. As a result, it is possible gluing an electronic device (e.g., the electronic device 205 above described in relation to FIG. 2) to the electronic board with the mounting surface 215M substantially parallel to the gluing surface of the same with greater precision.

Figure 6A:
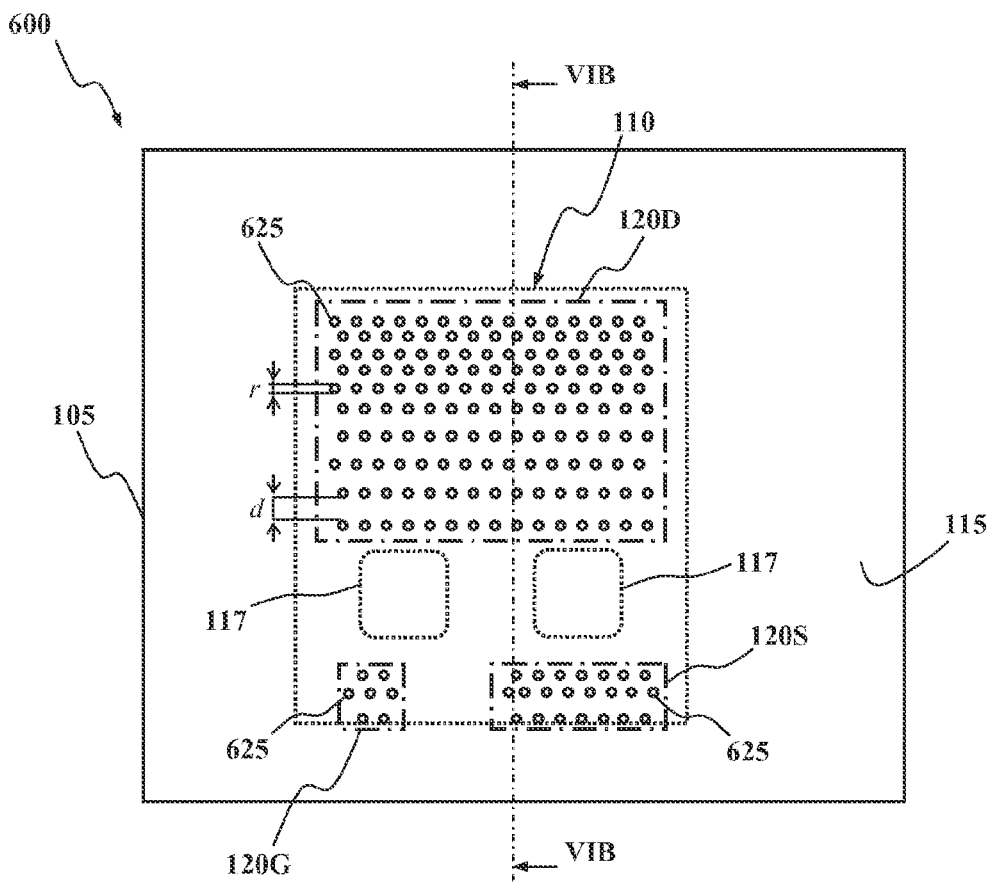
FIG. 6A illustrates a schematic plan view of a further electronic board according to another embodiment.
Figure 6B:
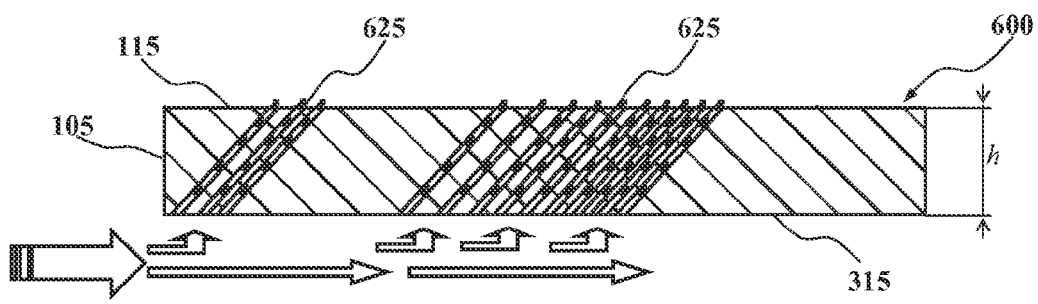
FIG. 6B illustrates a schematic side view in section according to the plan VIB-VIB of the electronic board shown in FIG. 6A.

In the FIGS. 6A and 6B are schematically illustrated a plan view and a cross-sectional side view according to plan VIB-VIB, respectively, of an electronic board 600 according to another embodiment.

The electronic board 600 differs from the electronic board described above as follows.

In the electronic board through holes 605 are formed titled with respect to the gluing surface 115 and to the bottom surface 315. In other words, the through holes 605 have an angle with the surfaces 115 and 315, preferably between 0° and 90°, more preferably between 30° and 60°, for example, 45°. It is important to note that the through holes 605 are formed tilted so as to facilitate the leaking of the soldering paste wave therein during the wave-soldering, i.e. they are tilted in the propagation direction of the wave (in the example at issue, an opening on the bottom surface 315 of the through holes 605 is shifted to the left compared to a corresponding opening on the gluing surface 115 thereof). The tilted through holes 605 allow to use (in addition to the capillarity action) the kinetic force associated with the wave of soldering paste for the ascending of the soldering paste along the same.

In addition, although not necessarily, the through holes 605 of the same contact region may be formed with a mutual variable distance d. For example, the distance d between two consecutive through holes 605 may be decreasing in the propagation direction of the wave of soldering paste during the wave soldering. In other words, the through holes 605 may be formed in a more spaced positions near a source point of the wave of soldering paste (at the left in the example at issue), becoming progressively thicker going away therefrom. In this way, the soldering paste reaches more easily the bonding surface even far from the source point of the wave of soldering paste, countering a fading of the kinetic energy associated with the propagation of the soldering paste. It should be noted that the through holes might be formed at a variable distance even in the case of the electronic board described in relation to FIG. 1 (i.e. with through holes formed perpendicular to the gluing and bottom surfaces).

Although in the present description reference is made to electronic devices of the "No-Lead" SMT-type, further embodiments may be configured to operate with different electronic devices of the SMT-type, for example, with pins protruding from the side surfaces of the insulating package. Furthermore, embodiments may be configured for operating with different elements other than pins of an electronic device such as exposed pads for the heat dissipation.

In addition, although the devices in the figures have been represented with pins protruding from the mounting surface, still further embodiments may be configured to operate with electronic devices having the pins coplanar with the mounting surface thereof.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments may even be practiced without the specific details set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

For example, although in the above description reference has continuously made to through holes having constant diameter, nothing prevents having the diameter of the holes to vary along their extensions (having flared holes for example), and/or different through holes having different diameters (e.g., diameter that decreases progressing towards in the propagation direction of the wave of soldering paste, for facilitating the ascending by capillarity action).

What is claimed is:

1. A method for manufacturing an electronic system including at least one electronic device of the surface-mounting type having an insulating package provided with a mounting surface and at least one contact pin exposed on the mounting surface, and an electronic board having an insulating substrate for supporting electronic devices, the insulating substrate comprising a gluing surface and an opposite surface to the gluing surface, the method comprising:
    forming a plurality of through holes in at least one contact region on the gluing surface of the electronic board,
    gluing on the gluing surface of the electronic board at least one electronic device,
    aligning the at least one contact pin with the at least one contact region,
    placing an electronic assembly comprising the at least one electronic device glued on the electronic board in a bath of soldering paste, and
    wave-soldering the glued at least one electronic device to the electronic board,
    wherein wave-soldering comprises:
        hitting the surface of the electronic board opposite to the gluing surface with a wave of soldering paste and forming, by capillary ascending of soldering paste in the through holes until overflowing on the gluing surface, at least one conductive contact contacting the at least one contact pin of the electronic device by soldering the at least one contact pin to the electronic board.

2. The method according to claim 1, wherein wave-soldering further comprises forming the at least one conductive contact integral with a corresponding thermally conductive path, adapted to dissipate heat generated by the at least one electronic device in operation.

3. The method according to claim 1, wherein forming a plurality of through holes comprises forming through holes perpendicular with respect to the gluing surface of the electronic board.

4. The method according to claim 1, wherein forming a plurality of through holes comprises forming through holes tilted with respect to the gluing surface of the electronic board.

5. The method according to claim 4, wherein forming the through holes tilted with respect to the gluing surface of the electronic board comprises: tilting the through holes forming each one with a corresponding opening on the bottom surface closer to the point of origin of the wave of soldering paste than a corresponding opening on the gluing surface.

6. The method according to claim 1, wherein forming a plurality of through holes further comprises defining a diameter of the through holes according to a density of the soldering paste and a thickness of the insulating substrate.

7. The method according to claim 1, wherein forming a plurality of through holes further comprises excluding at least one portion of at least one contact region from the forming of the plurality of through holes.

8. The method according to claim 7, further comprising using an adhesive in the excluded portions to attach the gluing surface of the electronic board to the at least one electronic device.

9. The method according to claim 1, wherein forming a plurality of through holes further comprises forming the through holes at a mutual distance decreasing in a propagation direction of the wave of soldering paste.

10. The method according to claim 1, wherein forming a plurality of through holes further comprises forming the through holes with a varying diameter along an extension from an aperture on the bottom surface to a corresponding aperture on the gluing surface.

11. The method according to claim 1, wherein forming a plurality of through holes further comprises forming the through holes with a diameter varying in the propagation direction of the wave of soldering paste.

12. A method, comprising:
    forming a plurality of through holes in at least one electrical contact region of an electronic board, said plurality of through holes extending between a gluing surface and an opposite surface of the electronic board,
    gluing at least one electronic device of the surface-mounting type to the gluing surface of the electronic board, said electronic device comprising having an insulating package provided with a mounting surface and at least one contact pin exposed on the mounting surface over the at least one contact region, wave-soldering the glued at least one electronic device to the electronic board by hitting the opposite surface of the electronic board with a wave of soldering paste that flows, by capillary action, in a manner ascending via the through holes from the opposite surface to overflow on the gluing surface to make at least one conductive contact between the at least one contact pin of the electronic device and the at least one contact region of the electronic board.

13. The method of claim 12, wherein gluing comprises inserting an adhesive between the mounting surface of the insulating package and an attachment region on the gluing surface of the electronic board.

14. The method of claim 13, wherein gluing further comprises inserting an adhesive between the at least one contact pin exposed on the mounting surface of the insulating package and an additional attachment region provided on at least one electrical contact region of an electronic board which is devoid of said plurality of through holes.

15. The method of claim 12, wherein wave-soldering further comprises forming the at least one conductive contact integral with a corresponding thermally conductive path, adapted to dissipate heat generated by the at least one electronic device in operation.

16. The method of claim 12, wherein forming a plurality of through holes comprises forming through holes perpendicular with respect to the gluing surface of the electronic board.

17. The method of claim 12, wherein forming a plurality of through holes comprises forming through holes tilted with respect to the gluing surface of the electronic board.

18. The method of claim 17, wherein forming the through holes tilted with respect to the gluing surface of the electronic board comprises: tilting the through holes forming each one with a corresponding opening on the bottom surface closer to the point of origin of the wave of soldering paste than a corresponding opening on the gluing surface.

19. The method of claim 12, wherein forming a plurality of through holes further comprises defining a diameter of the through holes according to a density of the soldering paste and a thickness of the insulating substrate.

20. The method of claim 12, wherein forming a plurality of through holes further comprises forming the through holes at a mutual distance decreasing in a propagation direction of the wave of soldering paste.

21. The method of claim 12, wherein forming a plurality of through holes further comprises forming the through holes with a varying diameter along an extension from an aperture on the bottom surface to a corresponding aperture on the gluing surface.

22. The method according to claim 12, wherein forming a plurality of through holes further comprises forming the through holes with a diameter varying in the propagation direction of the wave of soldering paste.

\* \* \* \* \*